United States Patent [19]

Yamakoshi

[11] Patent Number: 4,630,083
[45] Date of Patent: Dec. 16, 1986

[54] LIGHT-EMITTING SEMICONDUCTOR DEVICE

[75] Inventor: Shigenobu Yamakoshi, Ebina, Japan

[73] Assignee: Fujitsu Limited, Kawasaki, Japan

[21] Appl. No.: 522,569

[22] Filed: Aug. 12, 1983

[30] Foreign Application Priority Data

Aug. 12, 1982 [JP] Japan .................................. 57-140301

[51] Int. Cl.$^4$ .......................... H01L 33/00; H01S 3/19
[52] U.S. Cl. ......................................... 357/17; 357/16;
372/45; 372/47
[58] Field of Search ............... 372/47, 45, 44; 357/63,
357/61, 16, 17, 4

[56] References Cited

U.S. PATENT DOCUMENTS

| | | | |
|---|---|---|---|
| 4,352,116 | 9/1982 | Yariv et al. | 357/17 |
| 4,378,255 | 3/1983 | Holonyak, Jr. et al. | 357/91 |
| 4,438,446 | 3/1984 | Tsang | 357/16 |
| 4,503,540 | 3/1985 | Nakashima et al. | 372/47 |

FOREIGN PATENT DOCUMENTS 0112080  9/1978  Japan .................................. 372/47

OTHER PUBLICATIONS

Lee et al., "Low Threshold Current Transverse-Junction Laser on Semi-Insulating Substrates by MBE", Jan. 1980, pp. 26-30, Conference: Integrated and Guided-Wave Optics Technical Digest.

Primary Examiner—James W. Davie
Assistant Examiner—Georgia Y. Epps
Attorney, Agent, or Firm—Staas & Halsey

[57] ABSTRACT

A transverse junction strip structure light-emitting semiconductor device (laser) includes a laminated active layer of a multiquantum well structure. A P-type region of the semiconductor device is formed by doping P-type impurities into portions of the active layer and the clad layers between which the active layer is sandwiched. The P-type region includes a mixture region which is formed by diffusing P-type impurities into first semiconductor ultrathin layers serving as wells and second semiconductor ultrathin layers serving as barriers. The mixture region has a larger band gap than the first semiconductor ultrathin layers and forms a heterojunction with the first semiconductor ultrathin layers.

9 Claims, 15 Drawing Figures

RATIO OF Aℓ COMPOSITION

RATIO OF Aℓ COMPOSITION

RATIO OF Al COMPOSITION

RATIO OF Al COMPOSITION

LIGHT-EMITTING SEMICONDUCTOR DEVICE

BACKGROUND OF THE INVENTION

The present invention relates to a light-emitting semiconductor device and more particularly to a semiconductor laser of a transverse junction stripe (TJS) structure and a method of producing the laser.

A light-emitting semiconductor device, particularly, a semiconductor laser, is the most important member in an information processing system using light as the medium for generating information signals, e.g., an optical communication system. Considerable effort has been directed toward improving the properties of the laser, e.g., realization of a desired wavelength range of emission, stabilization of a single basic transverse mode emission and of a single longitudinal mode emission, improvement of the linearity of the light output-current (L-I) curve, reduction of the divergent angle of a laser beam and an increase of light output. In the past, various semiconductor laser structures have been proposed. The TJS structure is one of the structures suitable for decreasing the threshold current and for emitting a single transverse mode of light.

(2) DESCRIPTION OF THE PRIOR ART

By referring to FIGS. 1, 2 and 3, conventional semiconductor lasers having various TJS structures are explained.

In the case of a conventional TJS structure laser shown in FIG. 1, on a semi-insulating gallium arsenide (GaAs) substrate 1, an N-type aluminum gallium arsenide (AlGaAs) layer (clad layer) 2, an N-type GaAs layer (active layer) 3, an N-type AlGaAs layer (clad layer) 4 and an N-type GaAs layer (cap layer) 5 are epitaxially formed (or grown) in sequence. The GaAs layer 3 has an impurity concentration of greater than approximately $2 \times 10^{18}$ cm$^{-3}$. P-type impurities, e.g., zinc (Zn), are selectively diffused from the surface of the GaAs layer 5 to a portion of the AlGaAs layer 2 to form a P$^+$-type region 6 which has an impurity concentration of from approximately $1 \times 10^{19}$ to $1 \times 10^{20}$ cm$^{-3}$ and is indicated by oblique lines. Then the obtained semiconductor device is heat-treated at an elevated temperature to rediffuse Zn out of the P$^+$-type region 6, so that a P-type region 7 having an impurity concentration of approximately $2 \times 10^{18}$ cm$^{-3}$ is formed. A P-side electrode 8 is formed on the P$^+$-type region 6 and then an N-side electrode 9 is formed on the N-type GaAs layer 5. The portion including the PN junction of the GaAs layer 5 is removed by etching, as shown in FIG. 1.

In this case, the formation of the P$^+$-type region 6 and the P-type region 7 results in a PN junction in the layers 2, 3, and 4. Since AlGaAs has a larger band gap than that of GaAs, the current at a fixed voltage through a PN junction in AlGaAs is reduced by a factor of exp $(-\Delta Eg/kT)$ compared with that in GaAs, where $\Delta Eg$ is the difference between the band gap of AlGaAs and that of GaAs, k is Boltzmann's constant, and T is the absolute temperature. Therefore, the current can preferentially flow through the GaAs layer 3 so that laser light is emitted at a P-type region 7A of the GaAs layer 3.

In the case of another TJS structure laser shown in FIG. 2, an N-type GaAs substrate 1A is used instead of the semi-insulating GaAs substrate 1 of the above-mentioned laser in FIG. 1. An N-side electrode 9A is formed on the N-type GaAs substrate 1A. Reference numerals 2 to 8 in FIG. 2 indicate the same portions as those indicated by reference numerals 2 to 8 in FIG. 1.

In the case of the above two TJS structure lasers according to the prior art, junctions at the left and right sides of the lasing P-type region 7A of the GaAs layer 3 are homojunctions formed by thermal diffusion of Zn into the N-type GaAs layer 3. The injection efficiency $\gamma$ of current (i.e., the ratio of electron current to total current) is indicated by the following formula in the case of an infinite crystal:

$$\gamma = \frac{Lp \, Dn \, N}{LnDpP + LpDnN} = \frac{1}{\frac{Ln}{Lp} \cdot \frac{Dp}{Dn} \cdot \frac{P}{N} + 1}$$

where,
N is the electron density,
P is the hole density,
Dn is the diffusion constant of electrons,
Ln is the diffusion length of electrons,
Dp is the diffusion constant of holes, and
Lp is the diffusion length of holes.

Although the above quantities vary largely, in general, depending on the impurity concentrations of N-type and P-type regions, it is clear from the above-mentioned formula that the injection efficiency $\gamma$ is less than 1 (i.e., 100%). In order to obtain an injection efficiency of 100% ($\gamma = 1$), it is necessary to introduce a heterojunction structure into a TJS structure laser.

A TJS structure laser in which the heterojunction is introduced for improving the injection efficiency, as shown in FIG. 3, has been proposed. Reference numerals 1 to 5 and 7 to 9 except 6A in FIG. 3 indicate the same portions as those indicated by the same reference numerals in FIG. 1. After the N-type GaAs layer 5 is epitaxially grown in the case of the laser of FIG. 1, the portions of the layers 2 to 5 and the substrate 1 are selectively removed by etching. Then P$^+$-type AlGaAs is epitaxially grown to form a P$^+$-type AlGaAs region 6A compensating for the removed portions, as shown in FIG. 3. Thus, the P$^+$-type AlGaAs region 6A forms a heterojunction with the N-type GaAs layer 3.

The above-mentioned TJS structure lasers feature a low threshold current. However, improvement of the temperature dependence of the threshold current is necessary. In particular, in the case of integration of a laser and an electronic circuit element and in the case of an indium phosphide (InP)/indium gallium arsenide phosphide (InGaAsP) semiconductor laser system for lasing in a range of 1.0 to 1.6 $\mu$m, the threshold current value is remarkably increased by heat generated by a current due to a poor temperature dependence.

A threshold current density Jth of a semiconductor laser at a temperature t(K) is indicated in the following formula:

$$Jth(t) = Jth(T) \exp(t - T/T_0)$$

where T is the reference temperature (K), and $T_0$ is referred to as the characteristic temperature and represents the threshold-temperature dependence. In general, in a GaAs/AlGaAs system laser, $T_0 = 120$ to 165 K and in a InP/InGaAsP system laser, $T_0 = 50$ to 70 K.

In order to improve the stability and reliability of a semiconductor laser, it is necessary to decrease the threshold current density Jth, i.e., decrease the threshold current Ith and increase $T_0$.

SUMMARY OF THE INVENTION

An object of the present invention is to provide an improved light-emitting semiconductor device having a TJS structure.

Another object of the present invention is to provide a TJS structure laser in which the injection efficiency thereof is increased by the formation of a heterojunction, the threshold current is decreased, and the temperature dependence of the threshold current is decreased.

These and other objects of the present invention are achieved by a light-emitting semiconductor device including a first clad layer of a first conductivity type formed on a semiconductor substrate. A laminated active layer of the first conductivity type is formed on the first clad layer and is made of first semiconductor ultrathin layers and second semiconductor ultrathin layers by alternately placing the first and second semiconductor ultrathin layers on top of each other, the second semiconductor ultrathin layers having a large band gap than that of the first semiconductor ultrathin layers. A second clad layer of the first conductivity type is formed on the active layer, and a region of a second conductivity type extends from the top of the second clad layer to a portion of the first clad layer and comprises a mixture region of the first and second semiconductor ultrathin layers. The mixture region forms a heterojunction with the first semiconductor ultrathin layer and has a larger band gap than the first semiconductor ultrathin layer.

The laminated active layer has a quantum well structure (i.e., a superlattice structure), and the first and second semiconductor ultrathin layers each have a thickness which is less than the de Broglie wavelength of an electron wave. The semiconductor laser according to the present invention can be regarded as a multiquantum well heterostructure laser. The first semiconductor ultrathin layer serves as a quantum well and the second semiconductor ultrathin layer serves as a barrier.

The second conductivity type region is formed by doping second conductivity type impurities (e.g., Zn) into portions of the first and into second clad layers and the laminated active layer by a thermal diffusion process or an ion implantation process. The doped portions of the first and second semiconductor ultrathin layers form a second conductivity type mixture region while the other portions which are not doped remain intact.

DESCRIPTION OF THE PREFERRED EMBODIMENTS

The present invention will be further clarified by the following description of the preferred embodiments of the invention with reference to FIGS. 4A to 8.

Referring to FIGS. 4A, 4B, 4C, 5A and 5B, the production process of a TJS structure GaAs-AlGaAs system laser according to the first embodiment of the present invention is explained.

On a semi-insulating GaAs substrate 11, an N-type $Al_xGa_{1-x}As$ layer 12 as a first clad layer is formed (i.e., epitaxially grown) by a liquid phase epitaxy (LPE) process or a vapor phase epitaxy (VPE) process, a molecular beam epitaxy (MBE) process, or a metalorganic chemical vapor deposition (MOCVD) process. For example, the layer 12 has an impurity concentration of $5 \times 10^{17}$ cm$^{-3}$, a thickness of approximately 1.5 μm and a ratio "X" of 0.4 of the aluminum composition.

Then, an N-type laminated active layer 13 of a multiquantum well structure is formed by growing GaAs ultrathin layers and $Al_yGa_{1-y}As$ ultrathin layers alternately by an MBE or MOCVD process. The thickness of each of the ultrathin layers is smaller than the de Broglie wavelength ($\lambda d \lambda 30$ nm) of an electron wave. The AlGaAs layers have a larger band gap than that of the GaAs layers. The GaAs layers serve as quantum wells and the AlGaAs layers serve as the carrier. It is preferably to dope the N-type impurities (e.g., tin, silicon) into the GaAs and AlGaAs layers to a concentration of more than $10^{18}$ cm$^{-3}$ so as to provide a refractive index difference for confining a light in a transverse direction. It is possible to grow the GaAs and AlGaAs layers without the addition of the N-type impurities. For example, the active layer 13 comprises five GaAs layers approximately 10 nm thick and four $Al_{0.3}Ga_{0.7}As$ layers approximately 10 nm thick located between the GaAs layers.

An N-type $Al_zGa_{1-z}As$ layer 14 as a second clad layer is formed (i.e., epitaxially grown) on the active layer 13 by an LPE, VPE, MBE, or MOCVD process. For example, the layer 14 has an impurity concentration of $5 \times 10^{17}$ cm$^{-3}$, a thickness of approximately 1.5 μm and a ratio "Z" from 0.4 to 0.5 of the aluminum composition.

Figure 1:
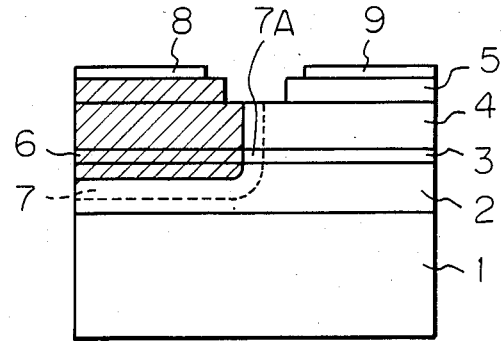
FIG. 1 is a schematic cross-sectional view of a conventional TJS structure laser according to the prior art.
Figure 2:
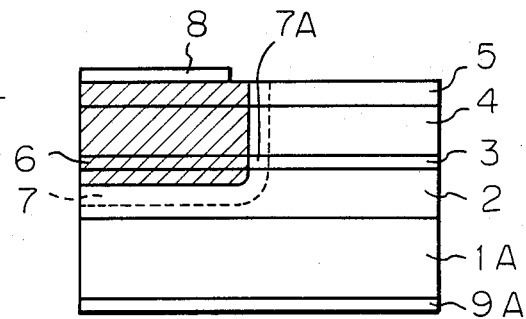
FIG. 2 is a schematic cross-sectional view of another conventional TJS structure laser according to the prior art.
Figure 3:
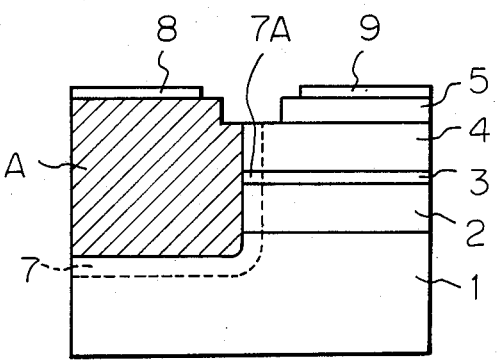
FIG. 3 is a schematic cross-sectional view of yet another conventional TJS structure laser according to the prior art.
Figure 4A:
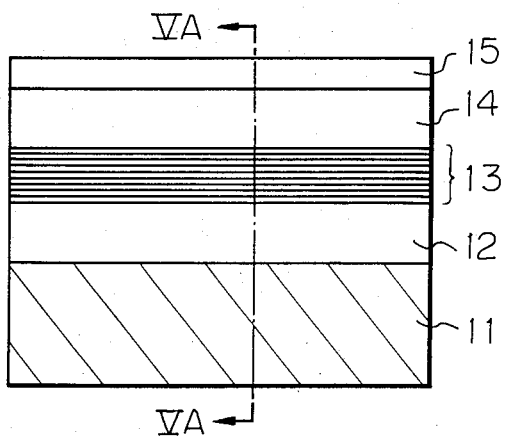
FIGS. 4A, 4B and 4C are schematic cross-sectional views of a TJS structure laser in various stages of production according to the present invention.

Next, an N-type GaAs layer 15 as a cap layer is formed (i.e., epitaxially grown) on the layer 14 by an LPE, VPE, MBE or MOCVD process, as shown in FIG. 4A. For example, the GaAs layer 15 has an impurity concentration of more than $1 \times 10^{18}$ cm$^{-3}$ and a thickness of approximately 0.3 μm. Generally, the layers 14 and 15 are consecutively formed by an LPE, VPE, MBE or MOCVD process.

Figure 5A:
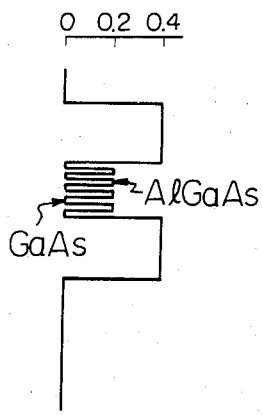
FIG. 5A is a diagram of the composition ratio of aluminum at the line VA—VA in FIG. 4A.

The ratio diagram of the aluminum component of the obtained semiconductor device at a cross-section taken along the line VA—VA in FIG. 4A varies as illustrated in FIG. 5A.

Figure 4B:
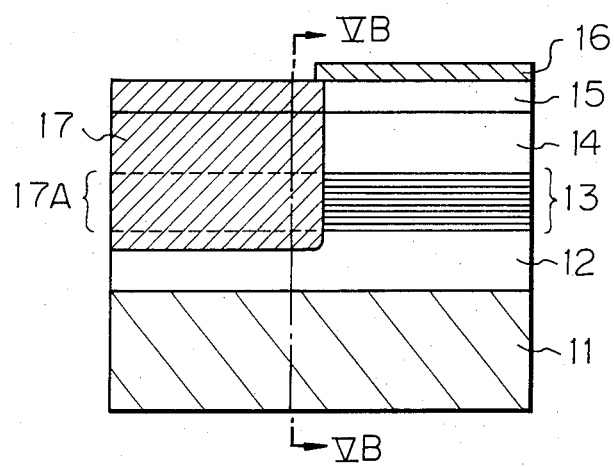

A masking layer 16 is selectively formed on the GaAs layer 15, as shown in FIG. 4B. For example, a silicon nitride ($Si_3N_4$) layer having a thickness of from 0.1 to 0.4 μm is formed on the layer 15 by a chemical vapor deposition (CVD) process and is selectively removed by a photoetching process. Thus, a masking layer 16 of $Si_3N_4$ is obtained.

The uncovered surface of the GaAs layer 15 to a portion of the AlGaAs layer 12 are doped with P-type impurities (e.g., Zn) so as to form a P-type region 17 (FIG. 4B). The masking layer 16 prevents the P-type impurities from penetrating into the layers 12 to 15 underlying the masking layer 16. The doping is carried out by the thermal diffusion of Zn at a temperature of from 600° C. to 900° C. in a closed tube system, using zinc arsenide ($Zn_3As_2$) as a zinc source. It is possible to carry out doping by ion implantation. If this is done, the masking layer 16 is formed as a photoresist layer having a thickness of from 3 to 5 μm or as a gold (Au) layer having a thickness of from 2 to 3 μm instead of as a $Si_3N_4$ layer. Zn ions are introduced up to the GaAs layer 12. Then the masking layer 16 is removed and a protecting layer (not shown) of $Si_3N_4$ or aluminum nitride (AlN) approximately 0.2 μm thick is deposited on the entire surface of the GaAs layer 15. Following the ion implantation, a heat-treatment (i.e., annealing) is carried out at a temperature of from 750° to 900° C. and thus the P-type region 17 is formed.

Figure 5B:
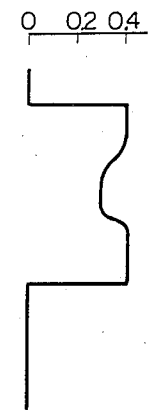
FIG. 5B is a diagram of the composition ratio of aluminum at the line VB—VB in FIG. 4B.

In the above-mentioned Zn diffusion step or the Zn ion implantation and heat-treatment steps, Zn atoms are introduced into portions of Ga and Al of the crystal lattice of each of the semiconductor layers 12 to 15, while Al atoms of the P-type AlGaAs layers (first and second clad layers) 12 and 14 and of the AlGaAs layers in the multiquantum well structure (i.e., superlattice structure) diffuse. Thus, the ratio diagram of the Al composition of the P-type region 17 at a cross-section taken along the line VB—VB in FIG. 4B varies as illustrated in FIG. 5B. Zn introduction and Al diffusion cause the superlattice structure of the laminated GaAs and AlGaAs ultrathin layers to break. Therefore, the Zn-doped portion of the laminated active layer 13 of the quantum well structure is regarded as a mixture (i.e., mixed crystal) region 17A of mixed GaAs and AlGaAs layers, i.e., a P-type AlGaAs region. The mixture region 17A forms a PN heterojunction with the GaAs ultrathin layers (quantum) wells).

Figure 4C:
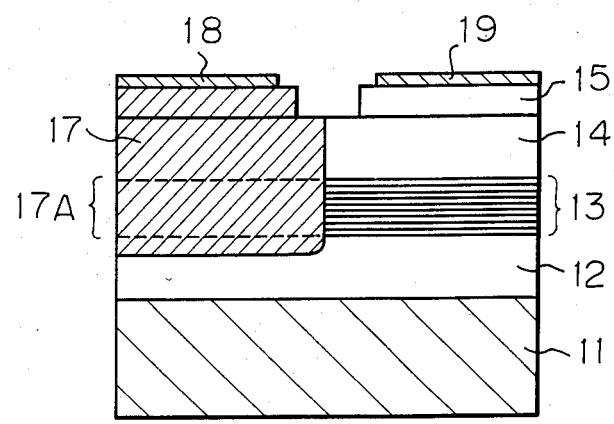

After the masking layer 16 (or the protective layer) is removed, A P-side electrode 18 of Au/Zn/Au is formed on the P-type region 17 by a conventional technique, as shown in FIG. 4C. Then an N-side electrode 19 of gold-germanium and gold (AuGe/Au)is formed on the N-type GaAs layer 15. The electrodes 18 and 19 are spaced approximately 5 μm from each other and are aligned with the PN junction. The GaAs layer 15 is selectively removed by etching to form a groove between the electrodes 18 and 19, as shown in FIG. 4C.

The obtained semiconductor device is cut into strips, and the strips are cleaved into laser chips. Each laser chip has an optical resonator having two reflection mirrors on the cleavage planes.

In the obtained TJS structure laser having the above-mentioned structure, when current flows from the P-side electrode 18 to the N-side electrode 19, holes are injected into the GaAs ultrathin layers in the quantum well structure layer 13 from the P-type mixture region of AlGaAs so as to lase. The flow of electrons from the GaAs ultrathin layers to the P-type mixture region is prevented by the heterojunction, therefore the injection efficiency of electron current becomes about 1 (100%). The refractive index of the mixture region 17A of the P-type AlGaAs is smaller than that of the GaAs ultrathin layers, which can confine light at the heterojunction plane. It is possible to control the refractive index difference by changing the ratio "Z" of the Al composition in the N-type $Al_zGa_{1-z}As$ layer (second clad layer) 14. In this case, the strip width of the resonator is the diffusion length of the holes (i.e., approximately 1 μm). The threshold current ($I_{th}$) of the obtained laser at a temperature of 300K was less than 10 mA, less than half that of a conventional laser, and the characteristic temperature ($T_0$) was above 200K, approximately 50K higher than that of a conventional laser.

Figure 6:
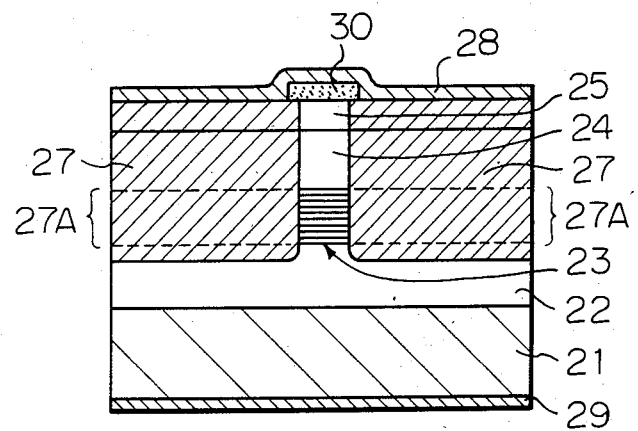
FIG. 6 is a schematic cross-sectional view of a TJS structure laser according to another embodiment of the present invention.

A TJS structure semiconductor laser according to a second embodiment of the present invention is shown in FIG. 6.

In this case, a substrate 21 is made of N-type GaAs having an impurity concentration of above $1 \times 10^{18}$ cm$^{-3}$. On the N-type GaAs substrate 21 an N-type AlGaAs layer (first clad layer) 22, a laminated active layer 23 of the multiquantum well structure, an N-type AlGaAs layer (second clad layer) 24, and an N-type GaAs layer (cap layer) 25 are formed in sequence in a manner similar to the above-mentioned production manner in the first embodiment. A masking layer 30 of, e.g., $Si_3N_4$ having a strip shape is formed on the surface of the GaAs layer 25 at the center thereof. P-type impurities (e.g., Zn) are doped from the uncovered surface of the GaAs layer 25 up to a portion of the AlGaAs layer 22 to form P-type regions 27, as shown in FIG. 6. Under the masking layer, portions of the layers 22 to 25 remain intact in a strip shape. Therefore, the laminated active layer 23 of the multiquantum well structure is sandwiched between Zn doped mixture regions 27A of P-type AlGaAs. Namely, each GaAs ultrathin layer of the active layer 23 forms a heterojunction with the P-type AlGaAs region at both sides thereof in a transverse direction. Then a P-side electrode 28 is formed on the masking layer 30 and on the P-type region 27 and an N-side electrode 29 is formed on the N-type GaAs substrate 21, as shown in FIG. 6.

Figure 7:
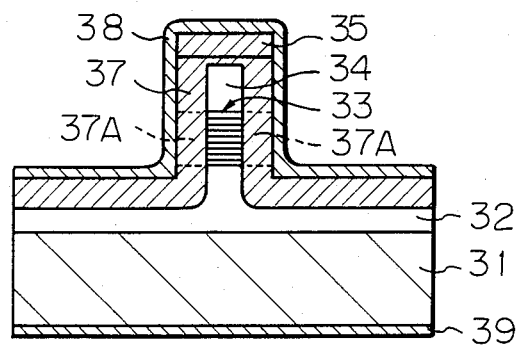
FIG. 7 is a schematic cross-sectional view of TJS structure according to yet another embodiment of the present invention.

A TJS structure semiconductor laser according to a third embodiment of the present invention is shown in FIG. 7.

In this case, on an N-type GaAs substrate 31 an N-type AlGaAs layer (first clad layer) 32, a laminated active layer 33 of the multiquantum well structure, an N-type AlGaAs layer (second clad layer) 34, and an N-type GaAs layer (cap layer) 35 are formed in sequence in the same production manner as that of the second embodiment. A photoresist layer (not shown) having a strip shape is formed on the surface of the GaAs layer 35 at the center thereof. Using an etchant, portions of the layers 32 to 35 are removed to form a mesa strip portion under the photoresist layer, which portion has a width of, e.g., from 3 to 5 μm. After removal of the photoresist layer, P-type impurities (e.g., Zn) are thermally diffused into the exposed surfaces of the layers 32 to 35 to form a P-type region 37 having a depth of, e.g., approximately 1 μm, as shown in FIG. 7. The P-type region 37 includes two mixture regions 37A of P-type AlGaAs which are formed by diffusing P-type impurities into the GaAs ultrathin layers and the AlGaAs ultrathin layers of the active layer 33. A P-side electrode 38 is formed on the P-type region 37 and then an N-side electrode 39 is formed on the N-type GaAs substrate 31. The obtained laser has a structure similar to that of the laser (FIG. 6) of the second embodiment and has an advantage in that the strip width of the optical resonator can be easily controlled.

Figure 8:
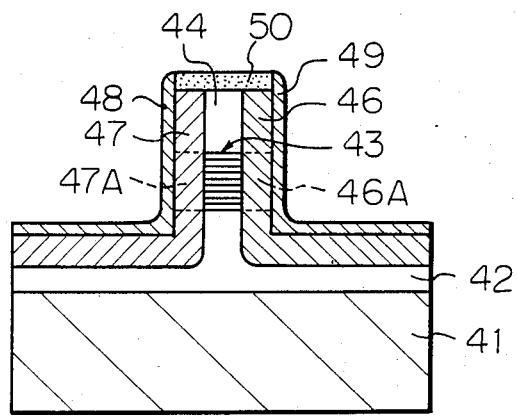
FIG. 8 is a schematic cross-sectional view of a TJS structure laser according to still another embodiment of the present invention.

A TJS structure semiconductor laser according to a fourth embodiment of the present invention is shown in FIG. 8.

On a semi-insulating GaAs substrate 41, an N-type AlGaAs (first clad) layer 42, a laminated active layer 43 of the multiquantum well structure comprising of GaAs ultrathin layers and $Al_yGa_{1-y}As$ ultrathin layers, and an N-type $Al_zGa_{1-z}As$ (second clad) layer 44 are formed in sequence in a manner similar to the production manner in the first embodiment. In this case, it is possible to make the first clad layer 42 and the second clad layer 44 of undoped semi-insulating AlGaAs S having a specific resistance of more than $10^4$ Ωcm. An insulating layer 50 is formed on the AlGaAs layer 44. Then the layers 42 to 44 and 50 are selectively etched to form a mesa strip portion under the insulating layer 50. N-type impurities (e.g., sulfur) are diffused from one side surface of the layers 42 to 44 thereinto to form an N-type region 46 including a mixture region 46A of N-type AlGaAs. The mixture region 46A is formed by diffusing the N-type impurities into GaAs ultrathin layers and AlGaAs ultrathin layers of the active layer 43, as shown in FIG. 8. Then, P-type impurities (e.g., Zn) are diffused from the other side surfaces of the layers 42 to thereinto to form a P-type region 47. The P-type region 47 includes a mixture region 47A of P-type AlGaAs which is formed by diffusing the P-type impurities into GaAs ultrathin layers and AlGaAs ultrathin layers of the active layer 43. A P-side electrode 48 is formed on the P-type region 47, and an N-side electrode 49 is formed on the N-type region 46.

Although the above-mentioned semiconductor lasers have the multiquantum well structure, the present invention can be applied as a semiconductor laser having a single quantum well structure.

Figure 9A:
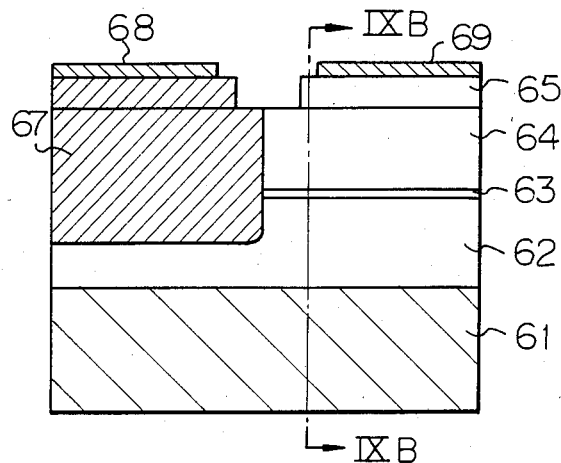
FIG. 9A is a schematic cross-sectional view of a TJS structure laser with a single quantum well according to an embodiment of the present invention.

A TJS structure semiconductor laser with a single quantum well according to the present invention is shown in FIG. 9A. In this laser, a substrate 61 is made of a semi-insulating GaAs. An N-type $Al_xGa_{1-x}As$ layer (a first clad layer) 62, an N-type GaAs ultrathin layer 63 serving as a well, an N-type $Al_zGa_{1-z}As$ layer (a second clad layer) 64, and an N-type GaAs layer (a cap layer) 65 are formed in sequence by an MBE, VPE, MOCVD or LPE process. The ratios "x" and "z" of an aluminum composition are, for example, 0.4.

Figure 9B:
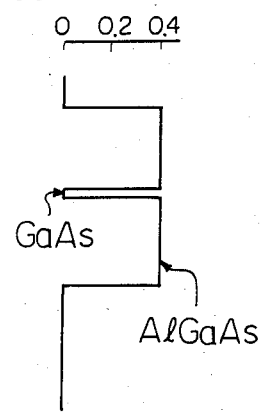
FIG. 9B is a diagram of the composition ratio of aluminum at the line IXV—IXB in FIG. 9A.

The ratio diagram of the aluminum component of the obtained semiconductor device at a cross-section taken along the line IXB-IXB in FIG. 9A varies as illustrated in FIG. 9B.

Next, P-type impurities (e.g. Zn) are selectively doped from the surface of the GaAs layer 65 up to a portion of the AlGaAs layer 62 so as to form a P-type region 67 by a manner similar to the above-mentioned production manner in the first embodiment. As a result of Zn introduction and Al diffusion in the doping step, the Zn-doped portion of the semiconductor ultrathin layer 63 of the single quantum well structure is changed to a mixture region (not shown) of the ultrathin layer and portions of the AlGaAs (clad) layers adjoining the ultrathin layer, i.e., a P-type AlGaAs region. The mixture region forms a PN heterojunction with the GaAs ultrathin layer 63.

Then a P-side electrode 68 and an N-side electrode 69 are formed, and the GaAs layer 65 is selectively removed to form a groove between the electrodes in a manner similar to that in the first embodiment, so that a TJS structure semiconductor laser with a single quantum well is obtained, as shown in FIG. 9A.

In the case of the above-mentioned single quantum well structure, an injection efficiency of holes and electrons in the well is relatively low. In order to increase the injection efficiency, it is preferable to adopt a graded index separate confinement heterostructure (GRIN-SCH). In this case, each of the clad layers formed on both sides of the active layer, i.e., an ultrathin layer serving as a well, comprises two layers. One of the two layers adjoining the active layer has a transitional composition of which a component varies so as to change the index thereof.

Figure 10A:
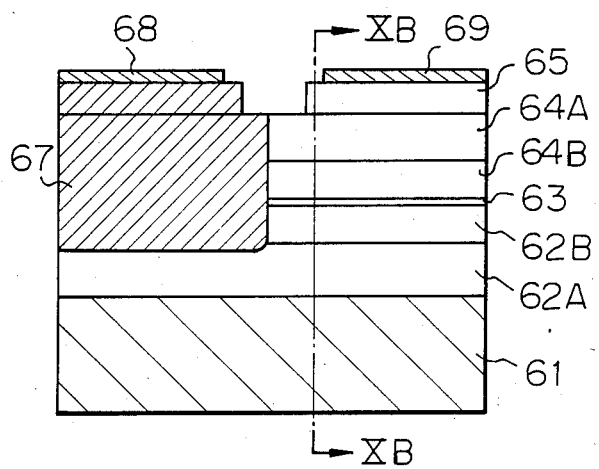
FIG. 10A is a schematic cross-sectional view of a TJS structure laser with a single quantum well according to another embodiment of the present invention.
Figure 10B:
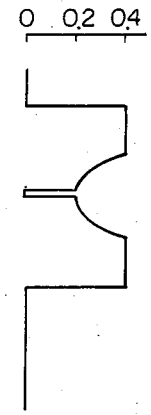
FIG. 10B is a diagram of the composition ratio of aluminum at the line XB—XB in FIG. 10A.

A TJS structure semiconductor laser with such GRIN-SCH is shown in FIG. 10A. In this laser, reference numerals 61, 63, 65, 67, 68 and 69 in FIG. 10A indicate portions similar to those indicated by the same reference numerals in FIG. 9A. A clad layer 62A and a transitional clad layer 62B which correspond to the first clad layer 62 in FIG. 9A are grown on the semi-insulating GaAs substrate 61. The clad layer 62A is $Al_xGa_{1-x}As$ in which "X" is, e.g., 0.4, and the transitional clad layer 62B has a composition which varies from the AlGaAs of the clad layer 62A so as to decrease the aluminum component. After the formation of the ultrathin layer 63, a transitional clad layer 64B and a clad layer 64A are grown on the ultrathin layer 63. The clad layer 64A is $Al_zGa_{1-z}As$ in which "z" is, e.g., 0.4 and the transitional clad layer 64B has a composition of which the aluminum component varies so as to increase up to that of the AlGaAs of the clad layer 64A. The ratio diagram of the aluminum composition of the layers 61 to 65 at a cross-section taken along the line XB—XB in FIG. 10A. In this case, the variation of the aluminum component of the transition clad layers 62B and 64B is indicated by curved lines (FIG. 10A). It is possible to grow the transition clad layers so as to have the ratio of the aluminum component as indicated in FIG. 9B. The P-type region 67 formed by the doping step includes a mixture region (not shown) of the ultrathin GaAs layer 63 and the portions of the transitional clad layers 62B and 64B. The mixture region also forms a PN heterojunction with the ultrathin layer 63 of N-type GaAs. As the result, the semiconductor laser having a structure shown in FIG. 10A is obtained.

Although the above-mentioned embodiments of the present invention relate to GaAs-AlGaAs system lasers, the present invention can be applied to a light-emitting device made of other compound semiconductor materials.

For example, an indium gallium arsenide phosphide (InGaAsP) system laser is usually used in the case of emitted light having a wavelength of more than 1 μm. In this case, a first clad layer of InP is formed (i.e., epitaxially grown) on an InP substrate. A laminated active layer of a multiquantum well structure comprising $In_{1-x}Ga_xAs_zP_{1-z}$ ultrathin layers serving as wells and either InP ultrathin layers or other InGaAsP ultrathin layers serving as barriers a is formed by an MBE, MOCVD, or VPE process. The barrier layers of InGaAsP having a larger band gap than the well layers of InGaAsP. Then, a second clad layer of InP is formed on the laminated active layer. It is possible to make the first clad layer and the second clad layer of inGaAsP so that they have a larger band gap than the former $In_{1-x}Ga_x$-$As_zP_{1-z}$ ultrathin layer. A cap layer of InP is formed on the second clad layer A p-type region is formed by selectively doping P-type impurities (e.g., Zn or Cd) from the surface of the cap layer up to the first clad layer. The P-type region is made to include a mixture region of P-type InGaAsP by diffusing the P-type impurities into the ultrathin layers of the laminated active layer. A P-side electrode and an N-side electrode are formed on suitable surface portions. Thus, it is possible to produce an InP-inGaAsP system laser in a manner similar to that in the above-mentioned embodiments. In the case of a InP-InGaAsP laser having an emitted wavelength of approximately 1.3 μm, the ratios "x" and "z" in the $In_{1-x}Ga_xAs_zP_{1-z}$ ultrathin layer are approximately 0.28 and approximately 0.61, respectively. In the case of the InP-InGaAsP laser having an emitted wavelength of approximately 1.55 μm, the ratios "x" and "z" are approximately 0.42 and approximately 0.89, respectively.

According to the present invention, in a TJS structure semiconductor laser, a stable single transverse mode emission can be attained under a high injection efficiency. The threshold current (Ith) is decreased and the characteristic temperature ($T_0$), related to the threshold current is increased, thereby improving the stability of the properties of the laser and lengthening the operating life thereof.

I claim:

1. A light emitting semiconductor device having a semi-insulating semiconductor substrate, comprising:
    a first clad layer of N-type AlGaAs formed on the semiconductor substrate;
    an N-type laminated active layer formed on said first clad layer comprising GaAs ultrathin layers and AlGaAs ultrathin layers alternately formed on top of each other, said AlGaAs ultrathin layers having a larger band gap than said GaAs ultrathin layers, each of said ultrathin layers having a thickness which is less than the de Broglie wavelength of an electron wave;
    a second clad layer of N-type AlGaAs formed on said active layer;
    a P-type region formed by introducing zinc from the top of said second clad layer into a portion of said first clad layer so that a mixture region of said GaAs and said AlGaAs ultrathin layers, is formed, said mixture region including AlGaAs having an amount of Al less than that of said AlGaAs ultrathin layers and forming a heterojunction with said GaAs ultrathin layers and having a larger band gap than said GaAs ultrathin layers;
    a first electrode formed on said second clad layer; and
    a second electrode formed on said P-type region.

2. A semiconductor device according to claim 1, wherein said first and second clad layers have a band gap larger than said GaAs ultrathin layers.

3. A semiconductor device according to claim 1, wherein a first cap layer is formed between said first electrode and said second clad layer, and a second cap layer is formed between said second electrode and said P-type region.

4. A semiconductor device according to claim 1, wherein said ultrathin layers have a thickness less than 30 nm.

5. A light emitting semiconductor device having a semi-insulating semiconductor substrate having first and second sides, comprising:
    a first clad layer of N-type AlGaAs formed on the first side of the semiconductor substrate;
    an N-type laminated active layer, formed on said first clad layer, comprising GaAs ultrathin layers and AlGaAs ultrathin layers alternately formed on top of each other, said AlGaAs ultrathin layers having a larger band gap than said GaAs ultrathin layers, each of said ultrathin layers having a thickness which is less than the de Broglie wavelength of an electron wave;
    a second clad layer of N-type AlGaAs formed on said active layer;
    a P-type region formed by introducing zinc from the top of said second clad layer into a portion of said first clad layer so that a mixture region of said GaAs and said AlGaAs ultrathin layers is formed, said mixture region including AlGaAs having an amount of Al less than that of said AlGaAs ultrathin layers and forming a heterojunction with said GaAs ultrathin layers and having a larger band gap than said GaAs ultrathin layers;
    a first electrode formed on the second side of the semiconductor substrate; and
    a second electrode formed on said P-type region.

6. A semiconductor device according to claim 5, wherein said laminated active layer and said second clad layer are strip-shaped and wherein said P-type region is located adjacent to both sides of said strip-shaped portion.

7. A light-emitting semiconductor device having a semi-insulating semiconductor substrate, comprising:
    a first clad layer of N-type AlGaAs formed on the semiconductor substrate;
    a semiconductor ultrathin layer of N-type GaAs formed on said first clad layer and having a thickness which is less than the de Broglie wavelength of an electron wave;
    a second clad layer of N-type AlGaAs formed on said GaAs ultrathin layer;
    a P-type region formed by introducing zinc and extending from above the top of said second clad layer into a portion of said first clad layer and forming a mixture region of said GaAs ultrathin layer and a portion of said first and second clad layers adjacent to said GaAs ultrathin layer and having a larger band gap than said GaAs ultrathin layers and said first and second clad layers having a larger band gap than said GaAs ultrathin layer;
    a first electrode formed on said second clad layer; and
    a second electrode formed on said P-type region.

8. A semiconductor device according to claim 7, wherein each of said first and second clad layers comprises two layers, one of said two layers contacting said GaAs ultrathin layer and having a transitional composition in which a component varies.

9. A semiconductor device according to claim 7, wherein said ultrathin layers have a thickness less than 30 nm.

* * * * *

UNITED STATES PATENT AND TRADEMARK OFFICE
CERTIFICATE OF CORRECTION

PATENT NO. : 4,630,083
DATED : DECEMBER 16, 1986
INVENTOR(S) : SHIGENOBU YAMAKOSHI

It is certified that error appears in the above-identified patent and that said Letters Patent is hereby corrected as shown below:

Col. 1, line 4, before "Background" insert --(1)--.

Col. 3, line 43, change "into second clad layers and" to --second clad layers and into--.

Col. 4, line 2, after "structure" insert --laser--;
line 42, "($\lambda$d$\lambda$30nm)" should be --($\lambda$d=30nm)--;
line 45, "carrier" should be --barrier--;
line 46, "preferably" should be --preferable--;
line 61, ""Z"" should be --"z"--.

Col. 5, line 54, "(quantum)" should be --(quantum--.

Col. 6, line 13, ""Z"" should be --"z"--.

Col. 7, line 21, delete "S".

Col. 8, line 29, ""X"" should be --"x"--;
line 66, delete "a".

Col. 9, line 3, "inGaAsP" should be --InGaAsP--;
line 6, "layer A p-type" should be --layer. A P-type--;

UNITED STATES PATENT AND TRADEMARK OFFICE
CERTIFICATE OF CORRECTION

PATENT NO. : 4,630,083
DATED : DECEMBER 16, 1986
INVENTOR(S) : SHIGENOBU YAMAKOSHI

It is certified that error appears in the above-identified patent and that said Letters Patent is hereby corrected as shown below:

Col. 9, line 14, "InP-inGaAsP" should be --InP-InGaAsP--;

line 29, "current" should be --current,--.

Signed and Sealed this

Twenty-fourth Day of November, 1987

Attest:

*Attesting Officer*

DONALD J. QUIGG

*Commissioner of Patents and Trademarks*